United States Patent
Cha et al.

(10) Patent No.: US 8,847,199 B2
(45) Date of Patent: Sep. 30, 2014

(54) NANOROD LIGHT EMITTING DEVICE AND METHOD OF MANUFACTURING THE SAME

(71) Applicant: Samsung Electronics Co., Ltd., Gyeonggi-do (KR)

(72) Inventors: Nam-Go Cha, Gyeonggi-do (KR); Geon-Wook Yoo, Gyeonggi-do (KR); Han-Kyu Seong, Seoul (KR); Sam-Mook Kang, Gyeonggi-do (KR); Hun-Jae Chung, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/672,019

(22) Filed: Nov. 8, 2012

(65) Prior Publication Data
US 2013/0112944 A1    May 9, 2013

(30) Foreign Application Priority Data
Nov. 9, 2011 (KR) .................. 10-2011-0116471

(51) Int. Cl.
| | | |
|---|---|---|
| *H01L 33/00* | (2010.01) | |
| *B82Y 20/00* | (2011.01) | |
| *H01L 33/24* | (2010.01) | |
| *H01L 33/38* | (2010.01) | |
| *B82Y 40/00* | (2011.01) | |
| *H01L 33/08* | (2010.01) | |
| *H01L 33/18* | (2010.01) | |

(52) U.S. Cl.
CPC ............. *H01L 33/24* (2013.01); *B82Y 20/00* (2013.01); *H01L 33/387* (2013.01); *B82Y 40/00* (2013.01); *H01L 33/08* (2013.01); *H01L 33/18* (2013.01); *Y10S 977/932* (2013.01)
USPC .......... 257/13; 257/E33.008; 438/34; 977/932

(58) Field of Classification Search
USPC ............... 257/13, E33.008; 438/34; 977/932
See application file for complete search history.

(56) References Cited

U.S. PATENT DOCUMENTS

| | | | |
|---|---|---|---|
| 2010/0078625 A1* | 4/2010 | Hsu ................................ | 257/13 |
| 2010/0327258 A1* | 12/2010 | Lee et al. ...................... | 257/14 |
| 2011/0095260 A1* | 4/2011 | Kim ............................... | 257/13 |
| 2011/0114915 A1* | 5/2011 | Lee et al. ...................... | 257/13 |
| 2012/0223289 A1* | 9/2012 | Gwo et al. .................... | 257/13 |
| 2012/0235117 A1* | 9/2012 | Fukui et al. .................. | 257/13 |

(Continued)

FOREIGN PATENT DOCUMENTS

| | | |
|---|---|---|
| JP | 2008-034482 A | 2/2008 |
| KR | 10-2007-0094292 A | 9/2007 |
| KR | 10-2011-0003751 A | 1/2011 |
| KR | 10-2011-0045398 A | 5/2011 |

*Primary Examiner* — Victor A Mandala
(74) *Attorney, Agent, or Firm* — McDermott Will & Emery LLP

(57) ABSTRACT

A nanorod light emitting device includes at least one nitride semiconductor layer, a mask layer, multiple light emitting nanorods, nanoclusters, a filling layer disposed on the nanoclusters, a first electrode and connection parts. The mask layer is disposed on the nitride semiconductor layer and has through holes. The light emitting nanorods are disposed in and extend vertically from the through holes. The nanoclusters are spaced apart from each other. Each of the nanoclusters has a conductor and covers a group of light emitting nanorods, among the multiple light emitting nanorods, with the conductor. The first electrode is disposed on the filling layer and has a grid pattern. The connection parts connect the conductor and the first electrode.

14 Claims, 11 Drawing Sheets

(56) References Cited

U.S. PATENT DOCUMENTS

| | | | |
|---|---|---|---|
| 2013/0092899 A1* | 4/2013 | Svensson | 257/13 |
| 2013/0092900 A1* | 4/2013 | Lowgren et al. | 257/13 |
| 2013/0240348 A1* | 9/2013 | Mi et al. | 204/157.5 |

* cited by examiner

NANOROD LIGHT EMITTING DEVICE AND METHOD OF MANUFACTURING THE SAME

CROSS-REFERENCE TO RELATED APPLICATION

This U.S. non-provisional application claims benefit of priority to Korean Patent Application No. 10-2011-0116471, filed on Nov. 9, 2011, in the Korean Intellectual Property Office, the entire contents of which are hereby incorporated by reference.

BACKGROUND

The inventive concept relates to a nanorod light emitting device capable of reducing a leakage current, and a method of manufacturing the same.

Light emitting devices may emit light by combination of electrons and holes injected into an active layer via a p-n junction structure of a semiconductor. Semiconductor light emitting devices may be classified into light emitting diodes (LEDs) and laser diodes (LDs). LEDs are regarded as highly efficient and environment friendly light sources due to their high brightness and relatively low power consumption, and thus, may be used in, for example, displays, optical communications, motor vehicles, and general lighting devices. Semiconductor light emitting devices use electroluminescence, i.e., a phenomenon whereby light is emitted from a semiconductor layer due to application of a current or a voltage. When electrons and holes are combined in an active layer of a semiconductor light emitting device, energy corresponding to an energy bandgap of the active layer may be emitted in the form of light. Accordingly, the wavelength of light emitted from the semiconductor light emitting device may vary according to the size of the energy bandgap of the active layer. Recently, blue LEDs and ultraviolet LEDs using nitride having excellent physical and chemical characteristics have been introduced. Also, since white light or other monochromatic light may be formed by using a blue or ultraviolet LED and a fluorescent material, the application range of light emitting devices has broadened. However, since a plurality of crystal defects generally exist in nitride-based compound semiconductor crystals, if electrons and holes are combined in crystals having defects, heat energy may be emitted instead of light energy and thus a luminous efficiency may be reduced.

Crystal defects may occur due to a mismatch in lattice constants or a difference in thermal expansion coefficients between a substrate and a compound semiconductor. In order to reduce crystal defects, a light emitting structure having a nanorod shape has been developed. Such structure has a smaller area contacting a substrate in comparison to a structure having a thin film shape, and thus, a mismatch in lattice constants or a difference in thermal expansion coefficients may occur less in comparison to the structure having a thin film shape. Currently, a core/shell nanorod structure has been suggested. One of the advantages of the core/shell nanorod structure is that crystal defects may be minimized. General light emitting devices having a thin film structure mainly have two types of crystal defects. The first crystal defect is mismatch dislocation caused by a lattice mismatch between a quantum well layer formed of InGaN and a quantum barrier layer formed of GaN. In this case, the mismatch dislocation exists in parallel in a growth layer. The second crystal defect is threading dislocation occurring on an interface between sapphire and GaN and reaching an emission layer in a direction in which a light emitting device structure grows.

In a nanorod structure, since a GaN layer may also grow in a horizontal direction, lattice mismatch dislocation may be reduced in comparison to general light emitting devices having a thin film structure. Also, since an area of a nanorod structure on a substrate is small, only a part of threading dislocation propagates to an active layer, and even when dislocation occurs, the dislocation may probably move to a near surface and may disappear. Second, since an active layer is formed along surfaces of cores in the form of a shell layer, an area of a light emitting surface may be increased, a current density may be reduced, and thus, a luminous efficiency may be improved.

SUMMARY

An aspect of the inventive concept relates to a nanorod light emitting device including at least one nitride semiconductor layer, a mask layer, multiple light emitting nanorods, nanoclusters, a filling layer disposed on the nanoclusters, a first electrode disposed on the filling layer, and connection parts. The mask layer may be disposed on the at least one nitride semiconductor layer and has through holes. The light emitting nanorods are disposed in and extend vertically from the through holes. The nanoclusters may be spaced apart from each other. Each of the nanoclusters may have a conductor and cover a group of light emitting nanorods, among the multiple light emitting nanorods, with the conductor. The first electrode may have a grid pattern. Connection parts may connect the conductor and the first electrode. Each of the light emitting nanorods may include a nanocore protruding from the through holes and doped with a first-type impurity, an emission layer disposed on a surface of the nanocore; and a semiconductor layer disposed on a surface of the emission layer and doped with a second-type impurity.

The at least one nitride semiconductor layer may be formed of $Al_xIn_yGa_{1-x-y}N$ ($0 \leq x, y \leq 1$, $x+y < 1$).

The mask layer may include at least one of $SiO_2$, $TiO_2$, $Si_3N_4$, $Al_2O_3$, TiN, AlN, $ZrO_2$, TiAlN, and TiSiN.

The nanocore may be formed of a nitride semiconductor.

The emission layer may have a single quantum well or multi-quantum well structure.

The filling layer may be formed of an insulator.

The filling layer may be formed of $SiO_2$, SiN, or silicon on glass (SOG).

The nanoclusters may be aligned in a repeated pattern.

The first electrode may include connection electrodes disposed in a grid pattern; and cluster electrodes disposed at positions where the connection electrodes cross each other.

The cluster electrodes may have a cross-sectional shape of a circle or a polygon.

The nanorod light emitting device may further include a substrate formed under the at least one nitride semiconductor layer.

The substrate may be formed of sapphire, silicon (Si), or Si carbide (SiC).

Another aspect of the inventive concept encompasses a nanorod light emitting device including at least one nitride semiconductor layer, a mask layer, multiple light emitting nanorods, nanoclusters, a filling layer disposed on the nanoclusters, a first electrode disposed on the filling layer, and connection parts. The mask layer may be disposed on the at least one nitride semiconductor layer and has through holes. The light emitting nanorods are disposed in and extend vertically from the through holes. The nanoclusters may be spaced apart from each other. Each of the nanoclusters may have a conductor and cover a group of light emitting nanorods, among the multiple light emitting nanorods, with the conductor. The first electrode may have a grid pattern. Connection parts may connect the conductor and the first electrode.

Still another aspect of the inventive concept relates to a method of manufacturing a nanorod light emitting device. A mask layer may be formed on a nitride semiconductor layer. One or more through holes may be formed in the mask layer. Multiple light emitting nanorods may be grown on the nitride semiconductor layer through the through holes. The light emitting nanorods are divided into groups of light emitting nanorods. Nanoclusters may be formed on the plurality of light emitting nanorods. Each of the nanoclusters may cover a corresponding one of the groups of light emitting nanorods. A filling layer may have via holes on the nanoclusters. A first electrode may be formed in a grid pattern on the filling layer.

According to the method, connection parts may be formed by filling the via holes with a conductive material; and the first electrode may be connected with the connection parts.

According to the method, when growing the multiple light emitting nanorods, nanocores may be grown on the nitride semiconductor layer through the through holes; an emission layer may be formed on surfaces of the nanocores; and a semiconductor layer may be formed on surfaces of the emission layer.

According to the method, when forming the nanoclusters, the light emitting nanorods may be covered with a photoresist; the light emitting nanorods may be grouped by photolithography; each of the nanoclusters may be formed by stacking a conductor on each group of light emitting nanorods; and the photoresist may be removed.

BRIEF DESCRIPTION OF THE DRAWINGS

The foregoing and other features of the inventive concept will be apparent from more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept. In the drawings, the thickness of layers and regions may be exaggerated for clarity.

DETAILED DESCRIPTION OF THE EMBODIMENTS

Figure 1:
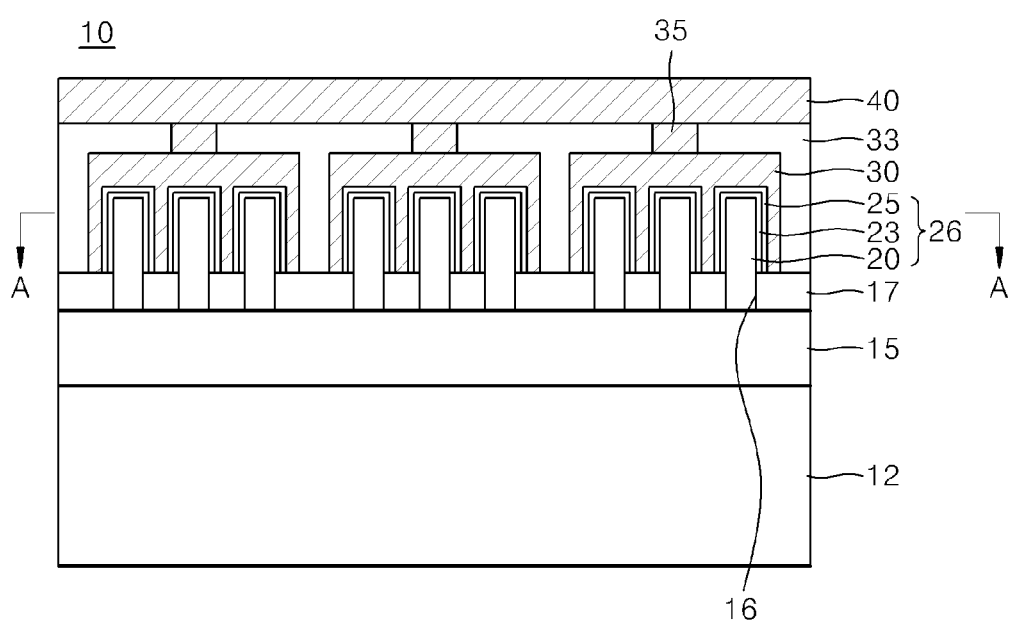
FIG. 1 is a cross-sectional view of an exemplary nanorod light emitting device according to an embodiment of the inventive concept.

Exemplary embodiments of the inventive concept will be described below in more detail with reference to the accompanying drawings. The embodiments of the inventive concept may, however, be embodied in different forms and should not be construed as limited to the embodiments set forth herein. Like reference numerals may refer to like elements throughout the specification.

In the drawings, the thickness of layers and regions may be exaggerated for clarity. It will also be understood that when an element such as a layer, region or substrate is referred to as being "on" or "onto" another element, it may lie directly on the other element or intervening elements or layers may also be present. Expressions such as "at least one," when preceding a list of elements, modify the entire list of elements and do not modify the individual elements of the list.

FIG. 1 is a cross-sectional view of an exemplary nanorod light emitting device 10 according to an embodiment of the inventive concept. The nanorod light emitting device 10 may include at least one nitride semiconductor layer 15, a mask layer 17 formed on the nitride semiconductor layer 15 and having one or more through holes 16, and light emitting nanorods 26 protruding from the through holes 16 of the mask layer 17 and spaced apart from each other.

A substrate 12 may be further disposed under the nitride semiconductor layer 15. The substrate 12 is used to grow the nitride semiconductor layer 15 and may be, for example, a sapphire substrate, a silicon (Si) substrate, an Si carbide substrate, or a nitride substrate. In addition, a substrate formed of a material for appropriately growing the nitride semiconductor layer 15, for example, ZnO, GaAs, $MgAl_2O_4$, MgO, $LiAlO_2$, $LiGaO_2$, or GaN, may be used. The substrate 12 may be removed after the nanorod light emitting device 10 is completely manufactured.

The nitride semiconductor layer 15 may be formed of nitride containing gallium (Ga). The nitride semiconductor layer 15 may be formed of $Al_xIn_yGa_{1-x-y}N$ ($0 \leq x, y \leq 1$, $x+y<1$) and may be formed of, for example, a material containing GaN, InGaN, or AlInGaN. The nitride semiconductor layer 15 may include a plurality of layers, for example, a nucleation layer for promoting growth, and a buffer layer. The nitride semiconductor layer 15 may be selectively undoped or doped.

The mask layer 17 may be patterned to grow the light emitting nanorods 26. The mask layer 17 may be formed of, for example, Si oxide, Si nitride, titanium (Ti) oxide, Ti nitride, aluminum (Al) oxide, or Al nitride. The mask layer 17 may include at least one of, for example: $SiO_2$, $TiO_2$, $Si_3N_4$, $Al_2O_3$, TiN, AlN, $ZrO_2$, TiAlN, and TiSiN. The mask layer 17 may include the through holes 16 for partially exposing the nitride semiconductor layer 15. The mask layer 17 may be etched to a desired through hole pattern by performing a lithography process. The through holes 16 may have a cross-sectional shape of, for example, a circle, an oval, or a polygon.

The light emitting nanorods 26 may not be formed on the mask layer 17 and may be formed through the through holes 16. Each of the light emitting nanorods 26 may include a nanocore 20 grown through the through hole 16, an emission layer 23 formed on a surface of the nanocore 20, and a semiconductor layer 25 formed on a surface of the emission layer 23.

The nanocore 20 may be formed as a nitride semiconductor layer and may be formed of, for example, $Al_xIn_yGa_{1-x-y}N$ ($0 \leq x, y \leq 1$, $x+y<1$). The nanocore 20 may be doped with a first-type impurity. The first type may be, for example, an n type, and Si, germanium (Ge), selenium (Se), or tellurium (Te) may be used as an n-type impurity.

The emission layer 23 is a layer for emitting light due to electron-hole recombination, and may have a single- or multi-quantum well structure formed by, for example, periodically varying x, y, and z values in $Al_xGa_yIn_zN$ so as to adjust a bandgap. For example, a quantum well structure may be formed by using a quantum well layer and a barrier layer for forming a pair of InGaN/GaN, InGaN/InGaN, InGaN/AlGaN, or InGaN/InAlGaN, and a light emitting wavelength band may be adjusted by controlling a bandgap energy of the InGaN layer according to a mole fraction of indium (In). The emission layer 23 may be radially grown on the nanocores 20 so as to surround the surfaces of the nanocores 20.

The semiconductor layer 25 may be formed of a group III-V semiconductor compound, for example, a nitride semiconductor. The semiconductor layer 25 may be formed of, for example, $Al_xIn_yGa_{1-x-y}N$ ($0 \leq x, y \leq 1$, $x+y<1$). The semiconductor layer 25 may be doped with a second-type impurity, and the second type may be, for example, a p type, and boron (B), Al, magnesium (Mg), calcium (Ca), zinc (Zn), cadmium (Cd), mercury (Hg), or Ga may be used as a p-type impurity. The first-type impurity and the second-type impurity may be the other way around. For example, the first type may be a p-type and the second type may be an n-type. The nanocores 20 may supply electrons to the emission layer 23, the semiconductor layer 25 may supply holes to the emission layer 23, and the emission layer 23 may emit light due to combination of the electrons and the holes. Light may be emitted from the surfaces of the light emitting nanorods 26, and a luminous efficiency may be high due to a large light emission area.

Nanoclusters 30 is formed by grouping the light emitting nanorods 26 in a predetermined number and covering every group with a conductor. The nanoclusters 30 may be aligned and spaced apart from each other. A filling layer 33 may be stacked to cover the nanoclusters 30. The filling layer 33 may be formed of an insulator so as to insulate the nanoclusters 30. The filling layer 33 may be formed of, for example, $SiO_2$, SiN, or silicon on glass (SOG).

Figure 2:
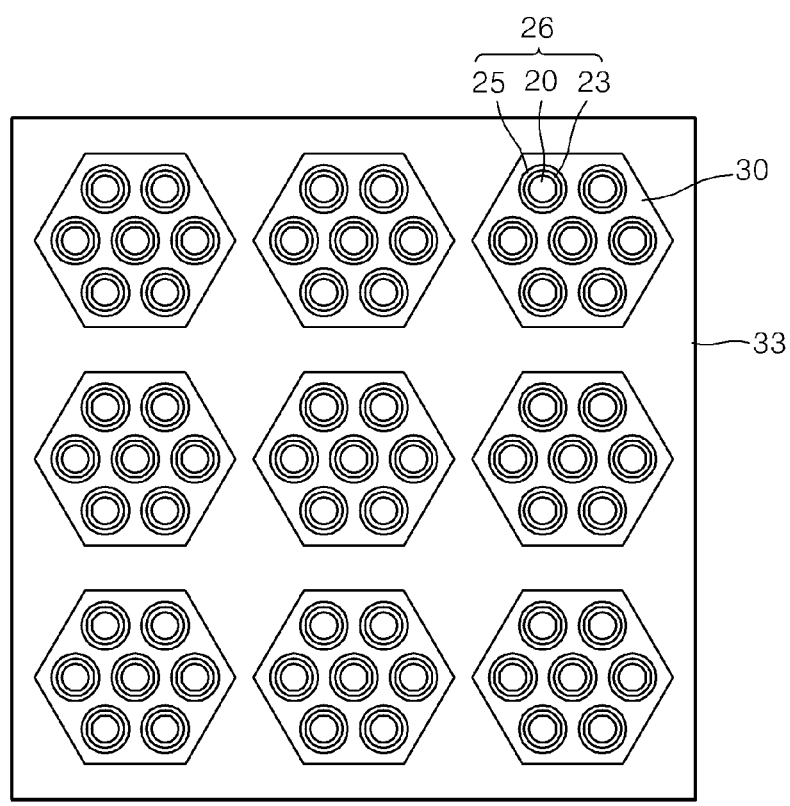
FIG. 2 is a cross-sectional view along a line A-A illustrated in FIG. 1.

FIG. 2 is a cross-sectional view along a line A-A illustrated in FIG. 1. Referring to FIG. 2, the nanoclusters 30 are aligned and spaced apart from each other. Each of the nanoclusters 30 may include a plurality of light emitting nanorods 26, for example, seven light emitting nanorods 26. The number of light emitting nanorods 26 included in each of the nanoclusters 30 may be varied. The nanoclusters 30 may be aligned in various patterns and may be aligned in a repeated pattern as illustrated in FIG. 2. More particularly, the nanoclusters 30 may be aligned in a repeated rectangular pattern. Alternatively, the nanoclusters 30 may be aligned in a repeated parallelogrammic pattern. The nanoclusters 30 may have a shape of, for example, a cylinder or a polyprism, that is, having a cross-sectional shape of a circle or a polygon.

Referring to FIG. 1, a first electrode 40 may be formed on the filling layer 33. Connection parts 35 may be formed between the nanoclusters 30 and the first electrode 40. The connection parts 35 may be formed of a conductor and may electrically connect the nanoclusters 30 and the first electrode 40. The first electrode 40 may be a transparent electrode. The first electrode 40 may be formed of, for example, a transparent conductive material such as indium tin oxide (ITO), indium zinc oxide (IZO), ZnO, or $SnO_2$. Alternatively, in a bottom emitting device for emitting light downward, the first electrode 40 may be formed of a metal. In this case, when the first electrode 40 is formed of a metal having a high reflectivity, light emitted from the emission layer 23 and proceeding toward the first electrode 40 may be reflected on the first electrode 40, and thus, a light extraction efficiency may be increased.

Figure 3:
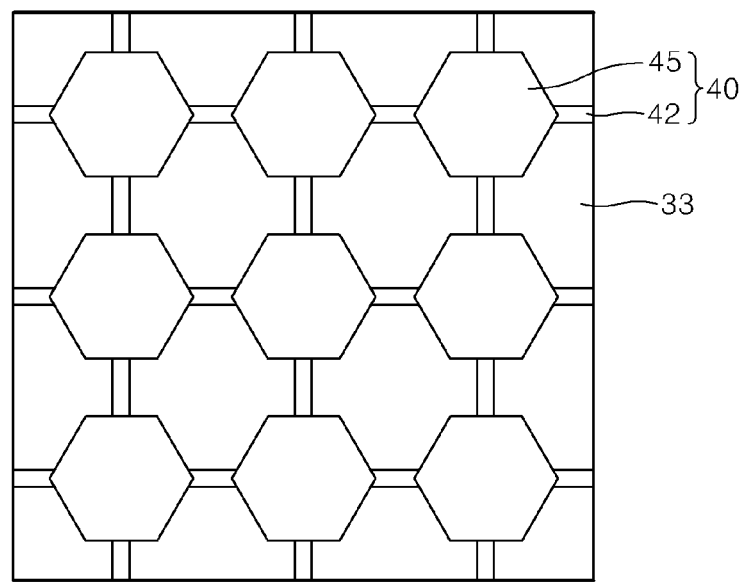
FIGS. 3 and 4 are diagrams showing examples of electrode patterns of the nanorod light emitting device illustrated in FIG. 1.
Figure 4:
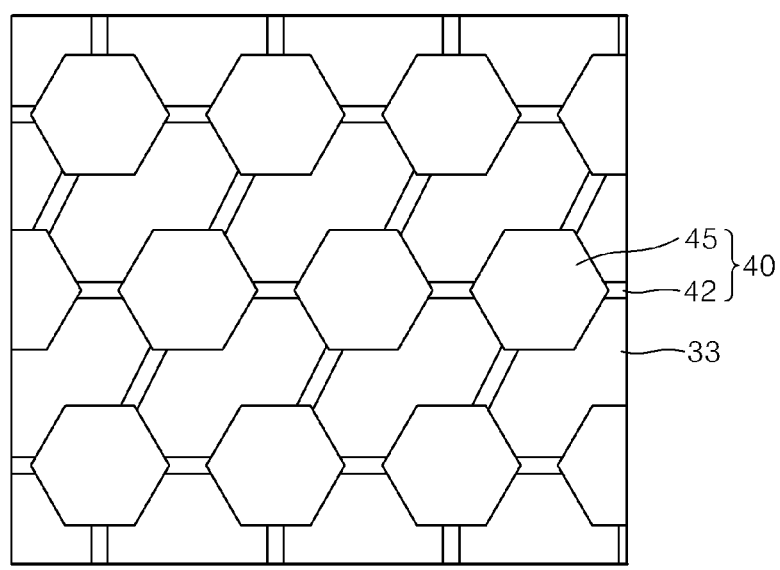

As illustrated in FIG. 3, the first electrode 40 may include connection electrodes 42 having a grid pattern, and cluster electrodes 45 disposed where the connection electrodes 42 cross each other. The cluster electrodes 45 may be disposed to meet the connection parts 35 and may be electrically connected to the nanoclusters 30 via the connection parts 35. The cluster electrodes 45 may have various shapes and may have, for example, the same cross-sectional shape as the cross-sectional shape of the nanoclusters 30. As illustrated in FIG. 3, the cluster electrodes 45 may have a hexagonal shape. The cluster electrodes 45 may be aligned in a repeated rectangular pattern (see FIG. 3) or a repeated parallelogrammic pattern (see FIG. 4) according to the alignment pattern of the nanoclusters 30. When the repeated parallelogrammic pattern is used, space may be used efficiently.

Figure 5:
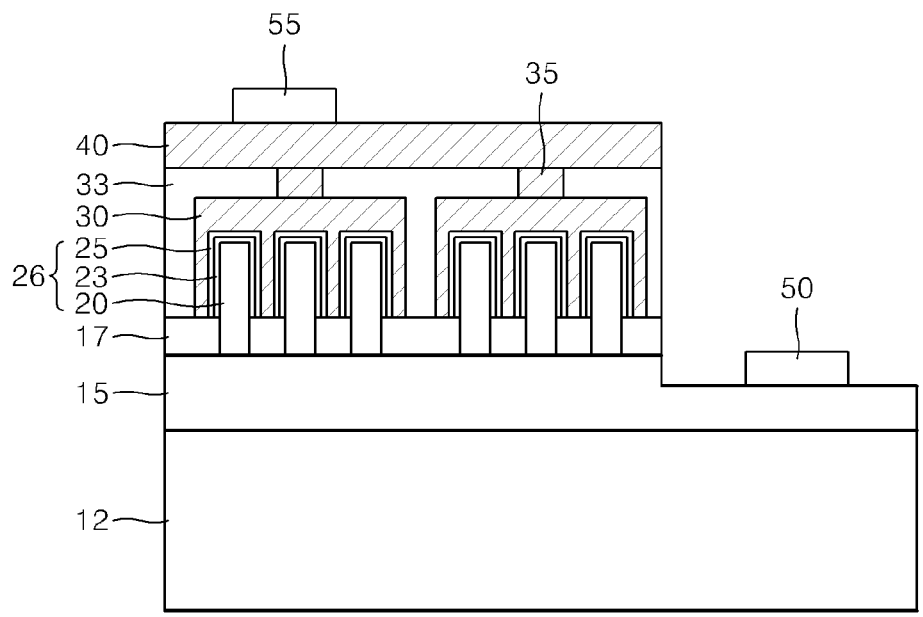
FIG. 5 is a cross-sectional view of an example of an electrode structure used in the nanorod light emitting device illustrated in FIG. 1.

FIG. 5 is a cross-sectional view of an example of an electrode structure used in the nanorod light emitting device 10 illustrated in FIG. 1. The nanorod light emitting device 10 may be mesa-etched to partially expose the nitride semiconductor layer 15. A second electrode 50 may be formed on the exposed portion of the nitride semiconductor layer 15. An ohmic electrode 55 may be further formed on the first electrode 40. For example, when a sapphire substrate is used as the substrate 12, the electrode structure illustrated in FIG. 5 may be employed.

Figure 6:
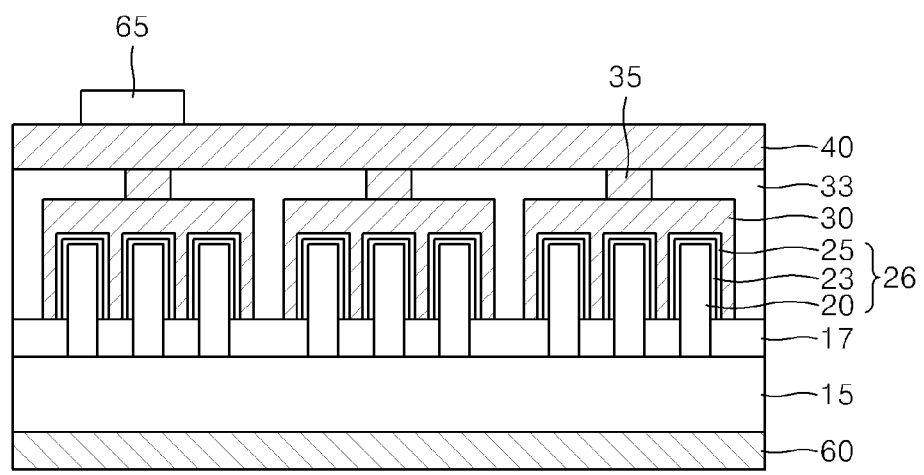
FIG. 6 is a cross-sectional view of another example of an electrode structure used in the nanorod light emitting device illustrated in FIG. 1.

FIG. 6 is a cross-sectional view of another example of an electrode structure used in the nanorod light emitting device 10 illustrated in FIG. 1. The substrate 12 may be removed from the nanorod light emitting device 10, and a third electrode 60 may be formed under the nitride semiconductor layer 15. For example, when a sapphire substrate is used as the substrate 12, the substrate 12 may be removed and the third electrode 60 may be formed. Alternatively, when a conductive substrate such as an Si substrate is employed as the substrate 12, the substrate 12 may not be removed and the third electrode 60 may be formed under the substrate 12. As described above, the third electrode 60 may be selectively formed according to the type of the substrate 12. Meanwhile, another ohmic electrode 65 may be further formed on the first electrode 40.

In a nanorod light emitting device according to an embodiment of the inventive concept, light emitting nanorods may be grouped in units of nanoclusters, and the nanoclusters may operate separately. When some of the light emitting nanorods have errors and do not emit light, a current may be continuously injected into the light emitting nanorods having errors, and thus, a leakage current may be increased. In this case, the leakage current may be reduced by cutting off a connection electrode connected to a nanocluster including the light emitting nanorods having errors. For example, a part having a high leakage current may be found by performing a device test, the location of a corresponding nanocluster may be checked, and a connection electrode connected to the nanocluster may be cut off by using a laser. After that, a bonding metal may be vapor-deposited, a packaging process may be performed, and thus, a leakage current due to a process error may be reduced.

Figure 7:
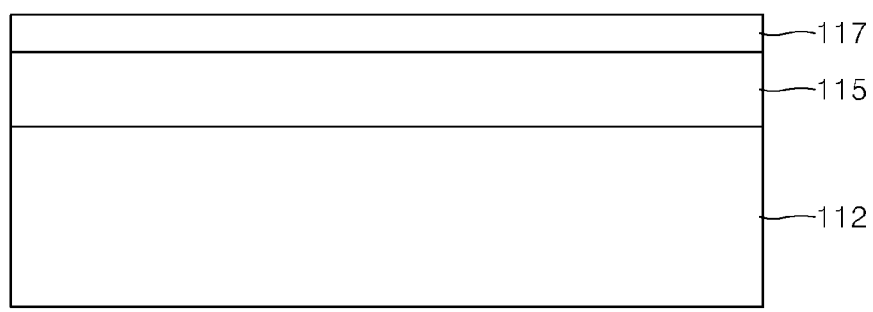
FIGS. 7 through 19 are diagrams for describing a method of manufacturing a nanorod light emitting device, according to an embodiment of the inventive concept.
Figure 8:
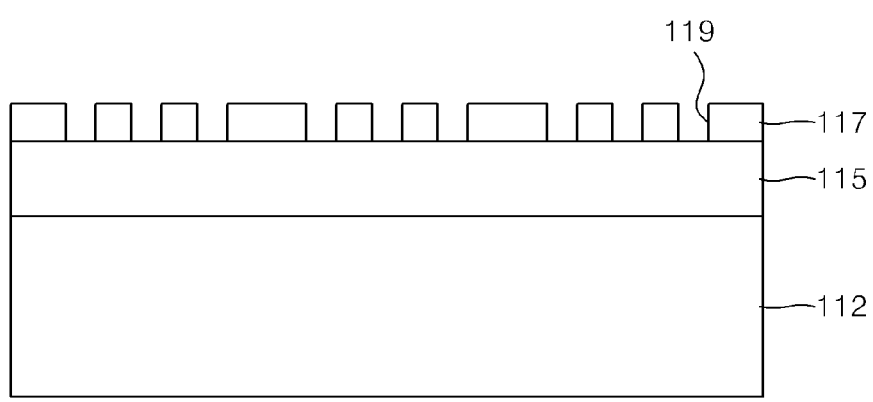

FIGS. 7 through 19 are diagrams for describing a method of manufacturing is a nanorod light emitting device, according to an embodiment of the inventive concept. Referring to FIG. 7, at least one nitride semiconductor layer 115 is stacked on a substrate 112. The nitride semiconductor layer 115 may include a plurality of layers and may be selectively doped. A mask layer 117 is vapor-deposited on the nitride semiconductor layer 115 and is patterned as illustrated in FIG. 8 by performing a semiconductor process, so as to form one or more through holes 119. The mask layer 117 may include at least one of, for example: $SiO_2$, $TiO_2$, $Si_3N_4$, $Al_2O_3$, TiN, AlN, $ZrO_2$, TiAlN, and TiSiN. The through holes 119 may expose the nitride semiconductor layer 115.

Figure 9:
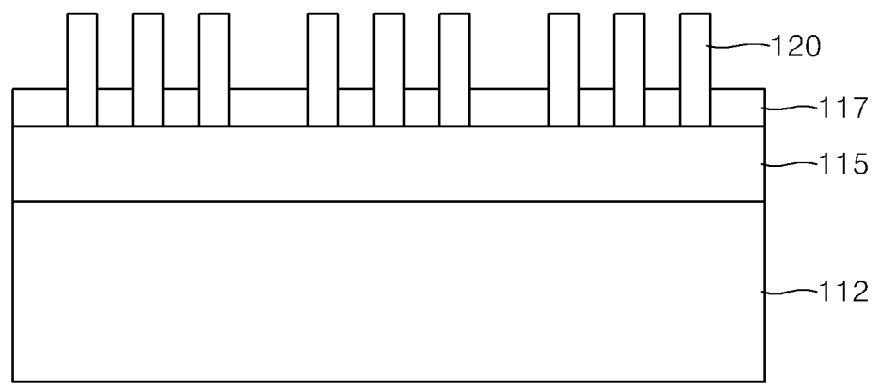
Figure 10:
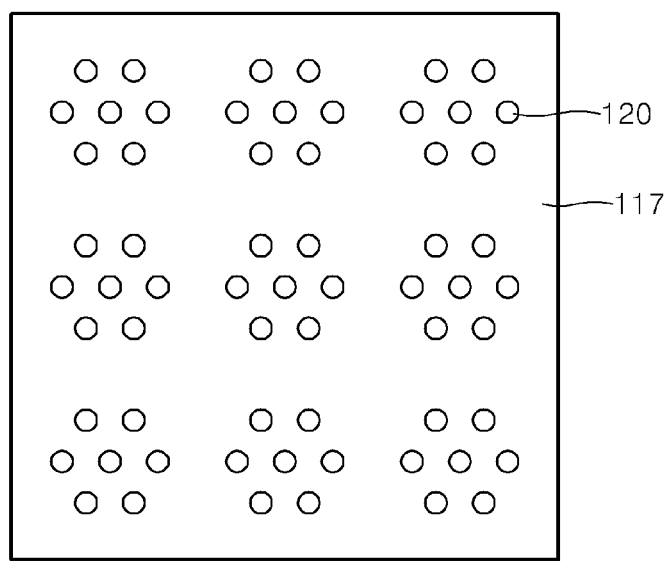
Figure 11:
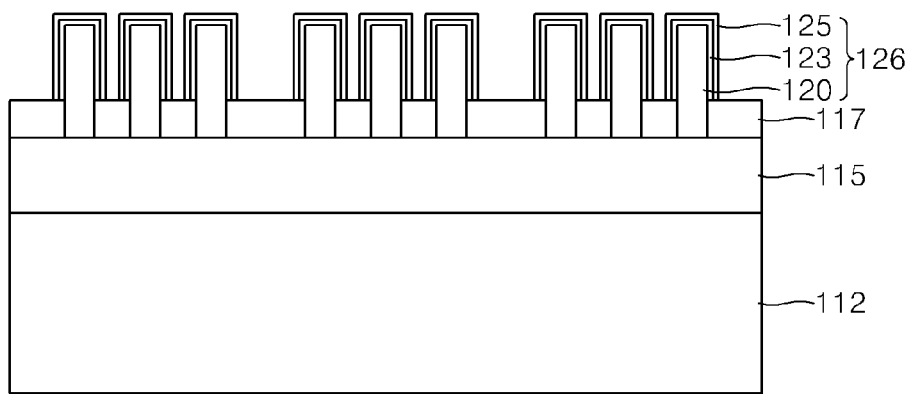
Figure 12:
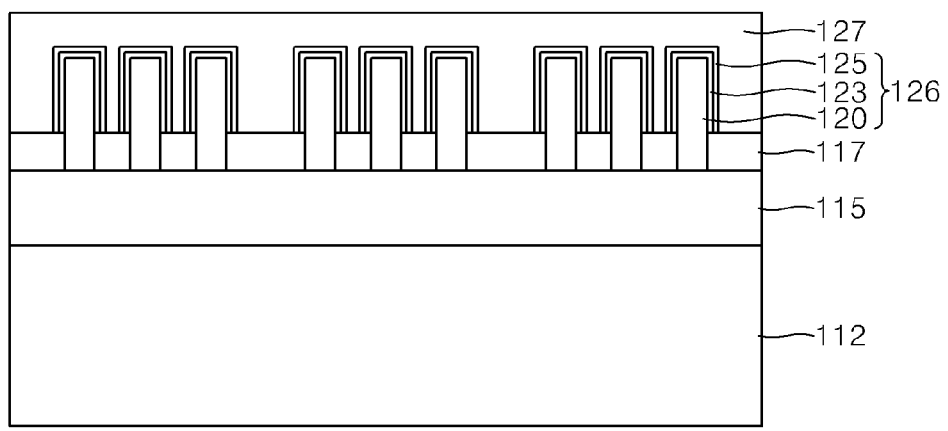
Figure 13:
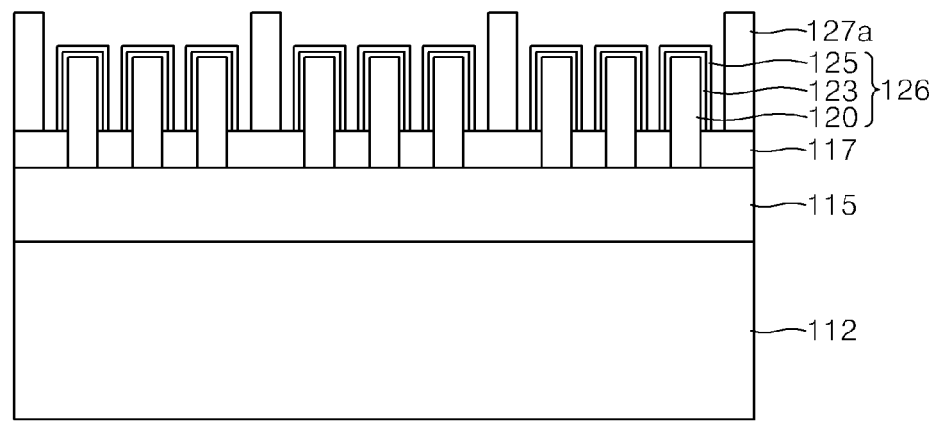
Figure 14:
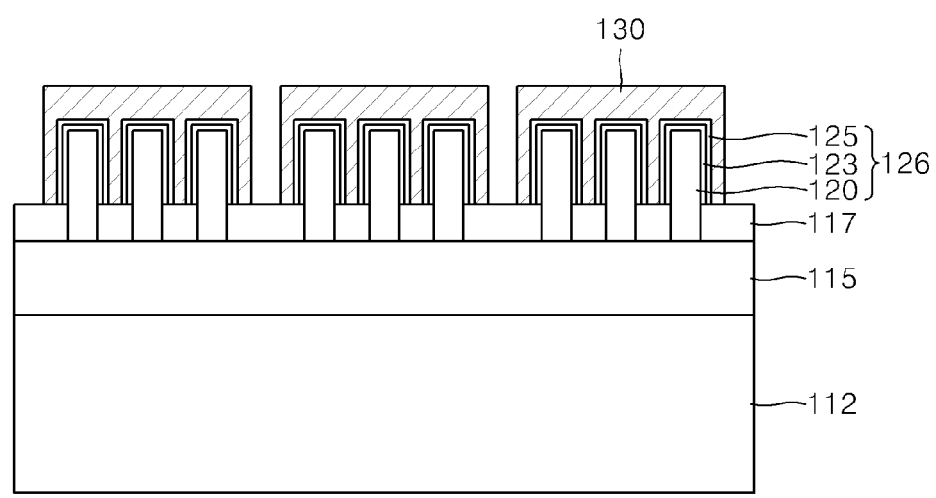
Figure 15:
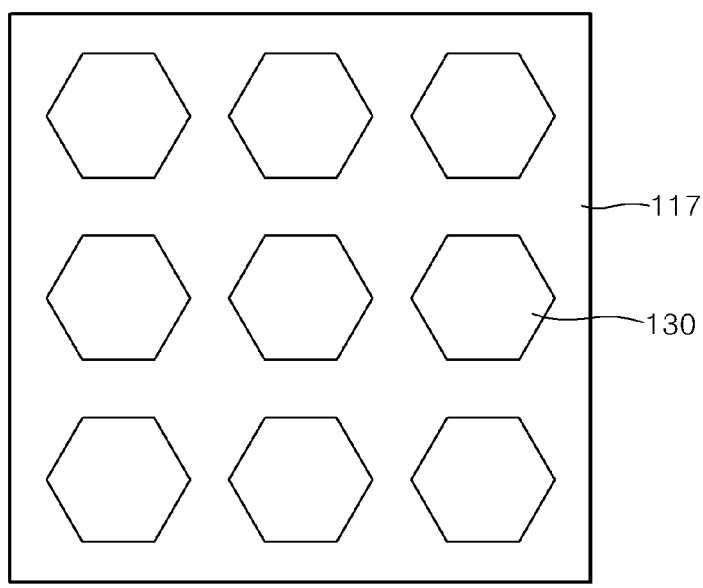

Referring to FIG. 9, nanocores 120 are grown on the nitride semiconductor layer 115 through the through holes 119. FIG. 10 is a plan view of the structure illustrated in FIG. 9. As illustrated in FIG. 10, the nanocores 120 may be formed in a pattern grouped by a predetermined number. Referring to FIG. 11, light emitting nanorods 126 are formed by sequentially vapor-depositing an emission layer 123 and a semiconductor layer 125 on surfaces of the nanocores 120. The light emitting nanorods 126 including the nanocores 120, the emission layer 123, and the semiconductor layer 125 may be formed according to the pattern of the mask layer 117. Then, as illustrated in FIG. 12, a photoresist 127 may be coated on the structure illustrated in FIG. 11. The photoresist 127 may be patterned by photolithography so as to partition the grouped light emitting nanorods 126. Then, when a conductive material is coated on a patterned photoresist 127a and the photoresist 127a is removed, as illustrated in FIG. 14, nanoclusters 130 separately covering the grouped light emitting nanorods 126 may be formed. Referring to FIG. 15, the nanoclusters 130 are spaced apart from each other and may have a cross-sectional shape of, for example, a hexagon.

Figure 16:
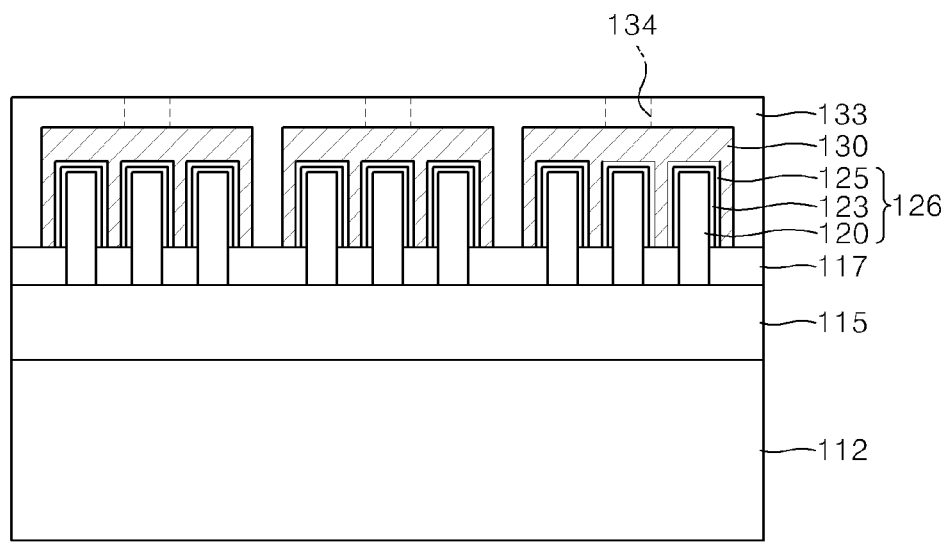
Figure 17:
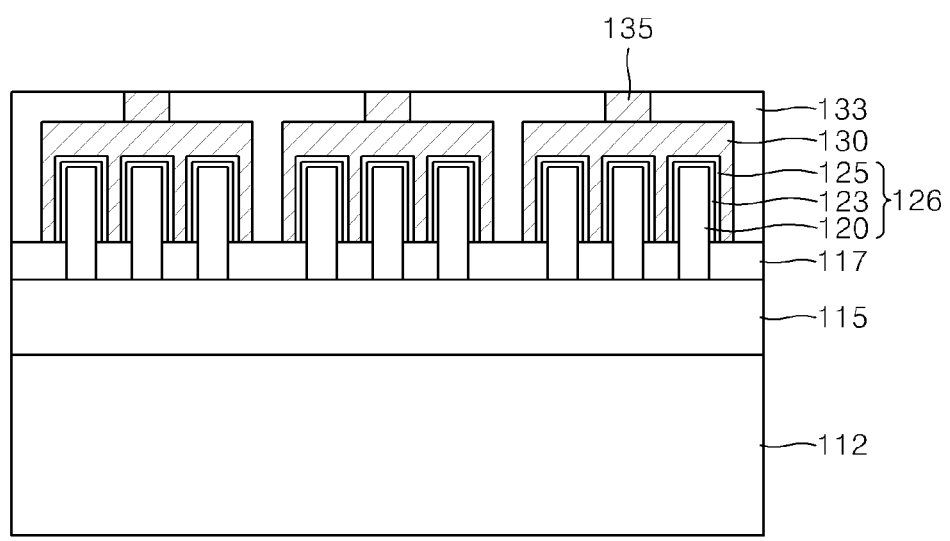
Figure 18:
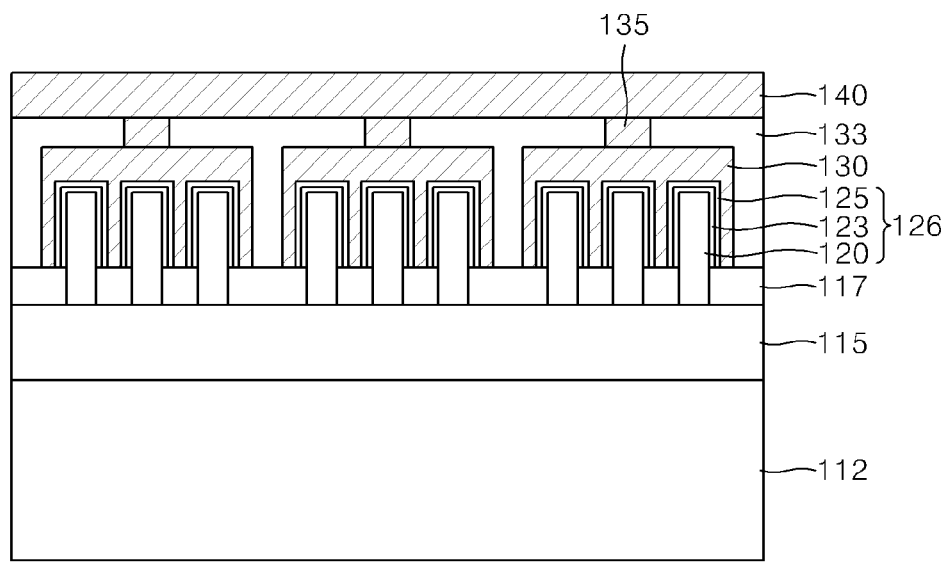
Figure 19:
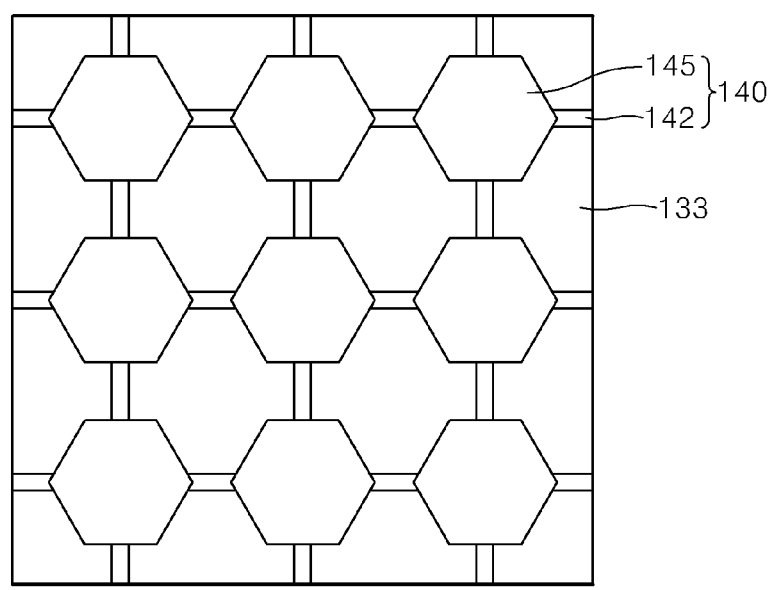

Then, as illustrated in FIG. 16, a filling layer 133 may be stacked on the nanoclusters 130. The filling layer 133 may be formed of, for example, an insulator. Via holes 134 may be formed in the filling layer 133 by performing, for example, a photo etching process so as to partially expose the nanoclusters 130. Referring to FIG. 17, the connection parts 135 may be formed by filling the via holes 134 with a conductive material. Then, as illustrated in FIG. 18, an electrode 140 may be formed on the filling layer 133. The electrode 140 may be formed in a grid pattern by, for example, photolithography. Referring to FIG. 18, the electrode 140 may include, for example, connection electrodes 142 having a grid pattern, and cluster electrodes 145 formed where the connection electrodes 142 cross each other. The cluster electrodes 145 may be disposed to be connected to the connection parts 135, and thus, the cluster electrodes 145 may be electrically connected to the nano clusters 130.

Meanwhile, when a nanocluster has an error, a connection electrode connected to the nanocluster having an error may be cut off. When some of light emitting nanorods have errors and do not emit light, a current may be continuously injected into the light emitting nanorods having errors, and thus, a leakage current may be increased. In this case, the leakage current may be reduced by cutting off a connection electrode connected to a nanocluster including the light emitting nanorods having errors. A current may be injected into only nanoclusters that operate normally.

Both a vertical structure, in which two electrodes are separately formed on and under a nano light emitting device, and a horizontal structure, in which two electrodes are formed together on or under a nano light emitting device, may be used as an electrode structure.

Although embodiments of the inventive concept have been shown and described, it will be appreciated by those skilled in the art that changes may be made without departing from the principles and spirit of the inventive concept, the scope of which is defined in the appended claims.

What is claimed is:

1. A nanorod light emitting device, comprising:
at least one nitride semiconductor layer;
a mask layer disposed on the at least one nitride semiconductor layer and having through holes;
a plurality of light emitting nanorods disposed in and extending vertically from the through holes;
nanoclusters spaced apart from each other, each of the nanoclusters having a conductor and covering a group of light emitting nanorods, among the plurality of light emitting nanorods, with the conductor;
a filling layer disposed on the nanoclusters;
a first electrode disposed on the filling layer and having a grid pattern; and
connection parts connecting the conductor and the first electrode,
wherein each of the light emitting nanorods comprises:
a nanocore protruding from the through holes and doped with a first-type impurity;
an emission layer disposed on a surface of the nanocore; and
a semiconductor layer disposed on a surface of the emission layer and doped with a second-type impurity.

2. The nanorod light emitting device of claim 1, wherein the at least one nitride semiconductor layer is formed of $Al_xIn_yGa_{1-x-y}N$ ($0 \le x,y \le 1$, $x+y<1$).

3. The nanorod light emitting device of claim 1, wherein the mask layer comprises at least one of: $SiO_2$, $TiO_2$, $Si_3N_4$, $Al_2O_3$, TiN, AlN, $ZrO_2$, TiAlN, and TiSiN.

4. The nanorod light emitting device of claim 1, wherein the nanocore is formed of a nitride semiconductor.

5. The nanorod light emitting device of claim 1, wherein the emission layer has a single quantum well or multi-quantum well structure.

6. The nanorod light emitting device of claim 1, wherein the filling layer is formed of an insulator.

7. The nanorod light emitting device of claim 1, wherein the filling layer is formed of $SiO_2$, SiN, or silicon on glass (SOG).

8. The nanorod light emitting device of claim 1, wherein the nanoclusters are aligned in a repeated pattern.

9. The nanorod light emitting device of claim 1, wherein the first electrode comprises:
connection electrodes disposed in a grid pattern; and
cluster electrodes disposed at positions where the connection electrodes cross each other.

10. The nanorod light emitting device of claim 7, the cluster electrodes have a cross-sectional shape of a circle or a polygon.

11. The nanorod light emitting device of claim 1, further comprising a substrate formed under the at least one nitride semiconductor layer.

12. The nanorod light emitting device of claim 11, wherein the substrate is formed of sapphire, silicon (Si), or Si carbide (SiC).

13. A nanorod light emitting device, comprising:
at least one nitride semiconductor layer;
a mask layer disposed on the at least one nitride semiconductor layer and having through holes;
a plurality of light emitting nanorods disposed in and extending vertically from the through holes;
nanoclusters spaced apart from each other, each of the nanoclusters having a conductor and covering a group of light emitting nanorods, among the plurality of light emitting nanorods, with the conductor;
a filling layer disposed on the nanoclusters;
a first electrode disposed on the filling layer and having a grid pattern; and
connection parts connecting the conductor and the first electrode.

14. The nanorod light emitting device of claim 13, wherein each of the light emitting nanorods comprises:
a nanocore protruding from the through holes and doped with a first-type impurity;

an emission layer disposed on a surface of the nanocore; and a semiconductor layer disposed on a surface of the emission layer and doped with a second-type impurity.

* * * * *

UNITED STATES PATENT AND TRADEMARK OFFICE
CERTIFICATE OF CORRECTION

PATENT NO.        : 8,847,199 B2
APPLICATION NO.   : 13/672019
DATED             : September 30, 2014
INVENTOR(S)       : Nam-Goo Cha et al.

Page 1 of 1

It is certified that error appears in the above-identified patent and that said Letters Patent is hereby corrected as shown below:

On the title page

Item (75) Inventors:

"Nam-Go, Cha, Gyeonggi-do (KR)
 Geon-Wook Yoo, Gyeonggi-do (KR)
 Han-Kyu Seong, Seoul (KR);
 Sam-Mook Kang, Gyeonggi-do (KR);
 Hun-Jae Chung, Gyeonggi-do (KR)"

should read

--Nam-Goo, Cha, Gyeonggi-do (KR)
 Geon-Wook Yoo, Gyeonggi-do (KR)
 Han-Kyu Seong, Seoul (KR);
 Sam-Mook Kang, Gyeonggi-do (KR);
 Hun-Jae Chung, Gyeonggi-do (KR)--

Signed and Sealed this
Thirty-first Day of March, 2015

Michelle K. Lee
*Director of the United States Patent and Trademark Office*